(12) United States Patent
Lunglmayr et al.

(10) Patent No.: US 8,190,977 B2
(45) Date of Patent: May 29, 2012

(54) DECODER OF ERROR CORRECTION CODES

(75) Inventors: Michael Lunglmayr, Munich (DE);
Jens Berkmann, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 945 days.

(21) Appl. No.: 12/199,414

(22) Filed: Aug. 27, 2008

(65) Prior Publication Data

US 2010/0058149 A1    Mar. 4, 2010

(51) Int. Cl.
*H03M 13/00*    (2006.01)

(52) U.S. Cl. ...................................................... 714/780

(58) Field of Classification Search .......... 714/780–794, 714/798–801
See application file for complete search history.

(56) References Cited

U.S. PATENT DOCUMENTS

| | | | | |
|---|---|---|---|---|
| 6,581,179 | B1 * | 6/2003 | Hassan | 714/776 |
| 7,293,223 | B2 * | 11/2007 | Gupta | 714/784 |
| 2005/0210358 | A1 * | 9/2005 | Chouly et al. | 714/753 |
| 2007/0033509 | A1 * | 2/2007 | Gupta | 714/795 |
| 2009/0132894 | A1 * | 5/2009 | Xu et al. | 714/780 |
| 2009/0132897 | A1 * | 5/2009 | Xu et al. | 714/796 |

OTHER PUBLICATIONS

"Factor Graphs and the Sum-Product Algorithm", Frank R. Kschischang, Brendon J. Frey and Hans-Andrea Loeliger, IEEE Transactions on Information Theory, vol. 47, No. 2, Feb. 2001, pp. 498-519.
"Encyclopedia of Sparse Graph Codes", David J.C. MacKay, reprinted from the Internet at: http://www.inference.phy.cam.ac.uk/mackay/codes/data.html, 17 pgs.
"Joint Proposal: High throughput extension to the 802.11 Standard: PHY", IEEE 802.11-05/1102r4, Jan. 2006, 94 pgs.
"Interative Reliability-Based Decoding of Low-Density Parity Check Codes", Marc P.C. Fossorier, IEEE Journal on Eelected Areas in Communications, vol. 19, No. 5, May 2001, pp. 908-917.
"An Introduction to LDPC Codes", William E. Ryan, NASA (NAGS-10643), INSIC EHDR program), Aug. 19, 2003, 22 pgs.
"Vertex Packings: Structural Properties and Algorithms", G.L. Nemhauser and L.E. Trotter, Jr., Mathematical Programming 8 (1975), North-Holland Publishing Company, pp. 232-248.

* cited by examiner

*Primary Examiner* — Nadeem Iqbal
(74) *Attorney, Agent, or Firm* — Eschweiler & Associates, LLC

(57) ABSTRACT

In a method of decoding data symbols into codewords, reliability information of the data symbols is provided. A first group of symbols from a first set of groups of symbols is selected, wherein the first set of groups of symbols is defined by at least a first parity-check of a parity-check matrix of a linear block code which has been used to encode the data symbols. The selection is based on the reliability information. A second group of symbols from a second set of groups of symbols is selected, wherein the second set of groups of symbols is defined by at least a second parity-check of the parity-check matrix. The selection is based on the selected first group of symbols and the reliability information. At least a part of the codeword is composed on the basis of the first group of symbols and the second group of symbols.

29 Claims, 6 Drawing Sheets

DECODER OF ERROR CORRECTION CODES

FIELD OF THE INVENTION

The invention relates to the field of communications and, more specifically, to systems dedicated to decoding of error correction codes such as linear block codes.

BACKGROUND OF THE INVENTION

Coding and decoding of data by the use of parity-check codes and/or block codes are techniques frequently used in data transmission systems in order to ensure reliability of data transmission. By coding, data is pre-processed in such a way as to allow for reliable data recovery by decoding. Decoding is the process of reconstructing transmitted data which has been coded and transmitted through unreliable media into codewords. Many different coding/decoding approaches are available depending on system and transmission channel considerations.

BRIEF DESCRIPTION OF THE DRAWINGS

Aspects of the invention are made more evident by way of example in the following detailed description of embodiments when read in conjunction with the attached drawing figures, wherein.

DETAILED DESCRIPTION OF THE INVENTION

In the following description and claims, the terms "coupled" and "connected", along with derivatives may be used. It should be understood that these terms may indicate that two elements co-operate or interact with each other regardless of whether or not they are in direct physical or electrical contact with each other. Further, although binary data symbols (i.e. bits) and binary codes are used for the purpose of explanation throughout the following description, higher order data symbols and non-binary codes may equally be applied and such alternatives are contemplated as falling within the scope of the present invention.

Figure 1:
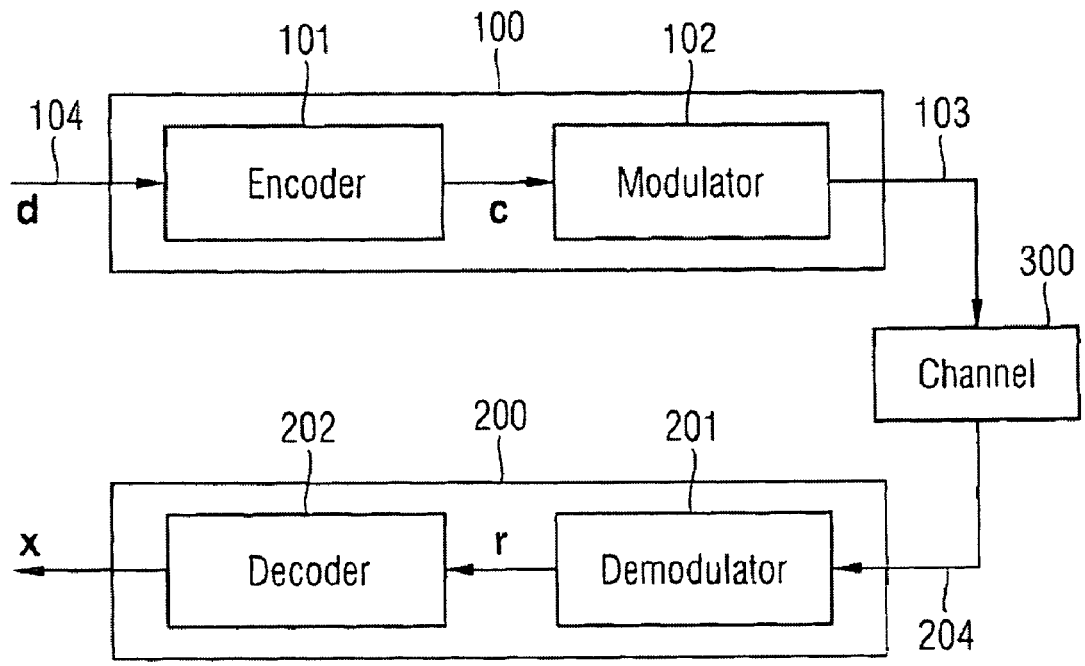
FIG. 1 is a schematic representation of a communications system comprising a transmitter and a receiver.

FIG. 1 shows an embodiment of a communications system comprising a transmitter 100 and a receiver 200. The transmitter 100 comprises an encoder 101 and may comprise further data processing units such as a modulator 102, a puncturing device (not shown) etc. The receiver 200 may comprise a demodulator 201, further data processing units such as e.g. a de-puncturing device (not shown) and a decoder 202. An output signal 103 of the transmitter 100 is transmitted via a channel 300 to form an input signal 204 of the receiver 200.

It is to be noted that FIG. 1 provides a schematic and strongly simplified representation of the transmitter 100 and the receiver 200 of the communications system. Usually, the transmitter 100 and the receiver 200 are equipped with additional data processing units (not shown) which are typically adapted to the specific field of application, the type of the channel 300 and other considerations, such as requirements or constraints. More specifically, the data communications system may be a radio communications system, in particular a mobile radio communications system, in which the channel 300 is represented by a radio link. Examples for such communications systems are digital video broadcasting-satellite (DVB-S) systems such as e.g. the DVB-S2 system, wireless local area network (WLAN) systems such as e.g. WLAN802.11n or wireless metropolitan area network (WMAN) systems such as e.g. stipulated in IEEE 802.16. Moreover, embodiments may comprise communications systems in which the channel 300 is established by a wired electrical or an optical link.

In FIG. 1, data symbols $d=(d_1, \ldots, d_k)$ to be transmitted to the receiver 200 are fed at input 104 into the encoder 101 of the transmitter 100. In one embodiment, the encoder 101 provides for a forward error correction (FEC) in the communications system. In one embodiment, the encoder 101 may use a linear block code for encoding the data bits $d_i$, $i=1, \ldots, k$. For instance, BCH (Bose-Chaudhuri-Hocquenghem) codes, terminated Turbo Codes or LDPC (Low Density Parity-Check) codes may be used. LDPC-codes are also known as Gallager codes and are proposed for many future communications systems for FEC as an alternative or complement to Turbo Codes.

Any linear block code can be described by a parity-check matrix H. The parity-check matrix H is of format m×n, i.e. has m rows and n columns. All codewords $c=(c_1, \ldots, c_n)$ must fulfill the equation $$Hc^T = 0. \qquad (1)$$

Thus, c is a codeword of the linear block code represented by the parity-check matrix H if and only if equation (1) is valid. Superscript T refers to the transpose of the indexed quantity.

Codeword generation out of the dataword d may be written as $$c = dG. \qquad (2)$$

G is a generator matrix of the linear block code and is of k×n format with k=n−m (with k, n, m being integers). As known in the art, one or more generator matrices G may be computed from the parity-check matrix H. If binary data are used (i.e. symbols are represented by bits), operations in equations (1) and (2) are carried out in the binary field GF(2).

The codeword c is fed into the modulator 102. Different modulation and/or puncturing schemes may be applied therein. After modulation, optional puncturing and adding of supplementary data, the codeword c is sent out by the transmitter 100 as a data block.

In one embodiment, the output of the modulator 102 may be subjected to further data processing in order to prepare the signal 103 for channel transmission. Such further data processing is not depicted in FIG. 1. By way of example, further data processing may comprise digital-to-analog conversion, up-conversion of the signal to a radio frequency band, amplification and radiating the amplified signal via a transmit antenna (not shown).

At the receiver 200, the input signal 204 is obtained e.g. by a receive antenna (not shown) or a physical channel 300 and, in one embodiment, may be subjected to signal processing not depicted in FIG. 1, such as e.g. filtering, down-conversion to an intermediate frequency (IF) band or baseband, analog-to-digital conversion and so on. The demodulator 201 may demodulate and optionally de-puncture the received signal 204 and outputs a received vector r. The n elements $r_i$, i=1, ..., n of the received vector r may be real-valued.

The decoder 202 decodes the received vector r to yield the decoded word x. The n elements $x_i$, i=1, ..., n of the decoded word x are estimates of the n elements $c_i$, i=1, ..., n of codeword c.

Figure 2:
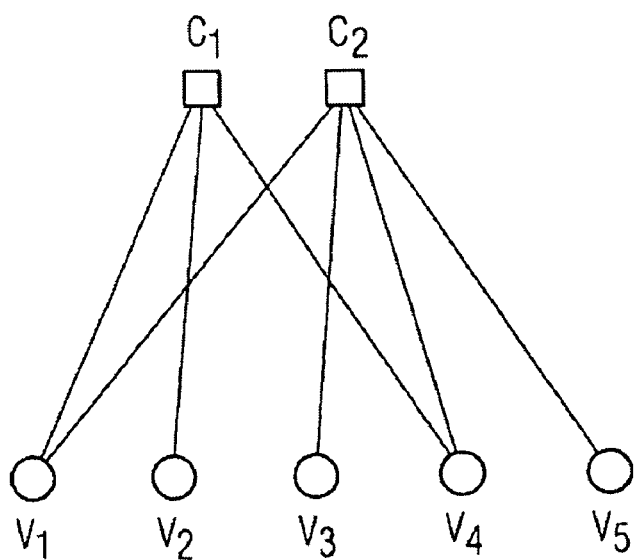
FIG. 2 shows a parity-check matrix H and a Tanner graph representation of the parity-check matrix H.

The parity-check matrix H can be used to generate a graph which also represents a block code, a so-called Tanner graph. FIG. 2 illustrates a parity-check matrix H of an LDPC code and the corresponding Tanner graph (for simplicity, the parity-check matrix H shown here is much smaller than the parity-check matrices of practically used LDPC codes).

A Tanner graph is a bipartite graph. The nodes of this graph can be divided into two classes. One class is termed check nodes (C-nodes, drawn as squares) and the other class is termed variable or bit nodes (V-nodes, drawn as circles). The C-nodes correspond to the rows of the parity-check matrix H (e.g. $C_1$ corresponds to row 1 of H) and the V-nodes correspond to the columns of the parity-check matrix H (e.g. $V_1$ corresponds to column 1). If the corresponding row of a C-node in the H matrix has a 1 at the column v it means that this C-node is connected to the V-node $V_v$ and vice versa. The degree of a node in the Tanner graph is the number of lines connected to this node (e.g. V-node $V_4$ has degree 2, C-node $C_1$ has degree 3).

In many cases LDPC codes are decoded using belief propagation (BP) algorithms. BP algorithms are also known as sum-product algorithms or message passing algorithms. These algorithms operate via passing messages through the Tanner graph.

In the following, a new representation of the decoding problem for linear block codes is presented. The new representation is based on the construction of a configuration graph CG=(V,E). This configuration graph CG will then be used for the construction of a new decoding scheme. V is the set of nodes of the configuration graph CG and E is the set of lines of the configuration graph CG.

Every linear block code can be represented in the form $H_D$=[D I], with I is the m×m identity matrix and D is an m×(n−m) matrix. Every row p of $H_D$ represents a parity-check. Each parity-check p defines an index set $J_p$ of codeword symbols participating in parity-check p. Thus, the index set $J_p$ is defined by the elements of row p of the parity-check matrix $H_D$ which are unequal to zero. Each index set $J_p$ of codeword symbols associated with a parity-check p defines a plurality of symbol groups $v_{pi}$ indexed by i, whereby each symbol group $v_{pi}$ is a symbol pattern which satisfies the parity-check p at index set $J_p$ of codeword symbols.

In the following, a symbol group $v_{pi}$ is referred to as a node $v_{pi}$. V is defined as the set of all nodes, V={$v_{pi}$}, for all parity-checks p and all symbol patterns i satisfying parity-check p. The set E of lines of the configuration graph CG is built according to the following rule: Two nodes $v_{ji}$ and $v_{kl}$ are interconnected if at least one symbol of node $v_{ji}$ and one symbol of node $v_{kl}$, which are located at any common position of the index sets $J_j$ and $J_k$, are different.

A set of nodes wherein no node of the set is connected to any other node of the set is referred to as a vertex packing. The construction principle explained above ensures that any vertex packing with m elements (i.e. with m nodes) represents a codeword. A vertex packing with m elements is termed m-packing in the following. Thus, any m-packing is a (valid) codeword.

Based on a configuration graph CG, new decoding schemes are available. According to the above, a configuration graph CG may be illustrated by p rows. Each row is associated with a specific parity-check p, i.e. with a row of the parity-check matrix $H_D$. Each row p of the configuration graph CG is represented by the set of nodes $v_{pi}$ associated with parity-check p. Nodes which are incompatible (i.e. which can not simultaneously be elements of an m-packing (i.e. a codeword)) are interconnected. On the other hand, nodes $v_{pi}$ with p=0, ..., m−1, which are not interconnected, can always be composed to form a codeword. Thus, the configuration graph CG is a representation of a rule teaching how to construct a codeword from nodes $v_{pi}$ (i.e. symbol groups) associated with index sets $J_p$ of codeword symbol positions. Such composition of an m-packing (codeword) may be carried out step by step by picking up one $v_{pi}$ node after the other.

By assigning weights to the nodes $v_{pi}$ of the configuration graph CG according to the received symbols, decoding and in particular maximum likelihood (ML) decoding can be performed by finding the maximum-weighted vertex packing. This problem will be referred to as maximum-weighted vertex packing problem (VPP). As will be described later, optimum ML decoders and sub-optimum ML decoders using the decoding scheme described above are feasible.

Generally, methods of decoding described herein allow for decoding of binary linear block codes as well as higher order linear block codes. For the sake of simplicity and without loss of generality, binary block codes are considered in the following. In this embodiment, the elements of the parity-check matrix and the symbols are bits, i.e. 0 or 1. A parity-check p can only be satisfied with an even number of participating bits set to 1. Thus, a node (bit group) $v_{pi}$ always has an even number of value 1 bits. If, for example, row p of parity-check matrix $H_D$ has a number of $z_p$ entries of value 1, the set of nodes associated with parity-check p is given by the set of all $z_p$-tuples satisfying the condition to have an even number of bits of value 1.

Figure 3:
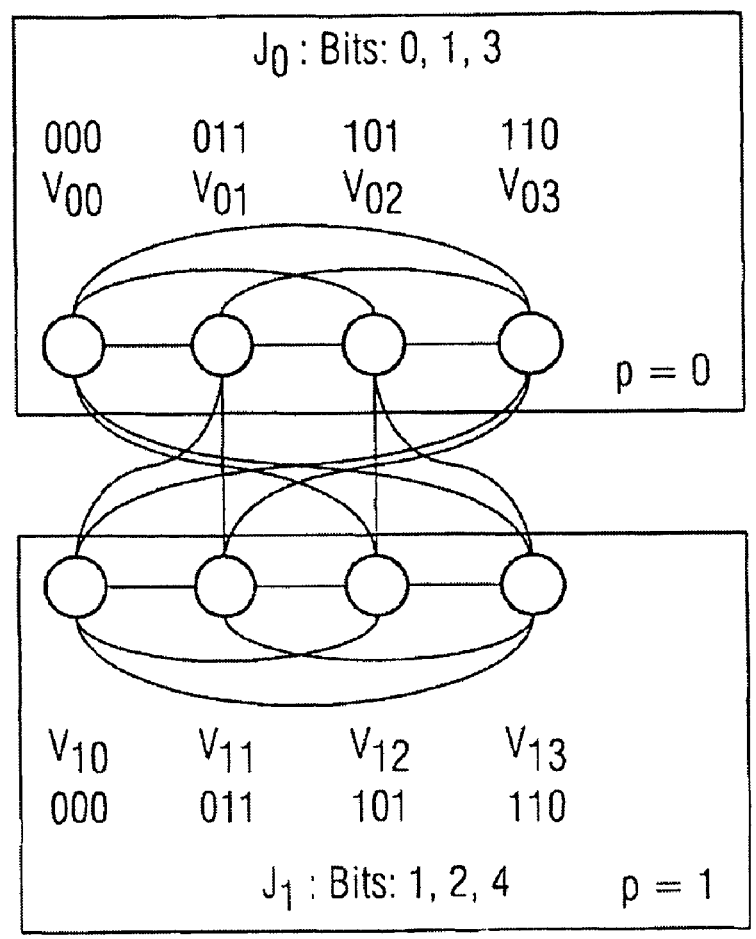
FIG. 3 shows a parity-check matrix $H_D$ and a configuration graph defined by the parity-check matrix $H_D$.

An example of a configuration graph CG associated with parity-check matrix $$H_D = \begin{pmatrix} 1 & 1 & 0 & 1 & 0 \\ 0 & 1 & 1 & 0 & 1 \end{pmatrix}$$

is illustrated in FIG. 3. Index set $J_0$ is given by the bits at positions 0, 1, 3 in row p=0 of matrix $H_D$ having the value 1. Index set $J_1$ is given by the bits at positions 1, 2, 4 in row p=1 of matrix $H_D$ having the value 1. Here, e.g. node $v_{12}$ represents bit group (101) associated with the index set $J_1$ of setting the bits 1 and 4 of the codeword to 1 and the bit 2 of the codeword to 0. Because parity-check p=0 and parity-check p=1 have the bit 1 at position 1 in common, node $v_{12}$ is connected to the nodes $v_{00}$ and $v_{02}$, i.e. bit groups (000) and (101). These nodes $v_{00}$ and $V_{02}$ correspond to combinations of bits satisfying parity-check p=0 but assuming the bit at position 1 is 0, i.e. are incompatible with node $v_{12}$. In this example, every set consisting of two nodes $v_{pi}$, p=0, 1 and i=0, ..., 3 which are not connected corresponds to a codeword.

It is to be noted that the parity-check matrix underlying the configuration graph CG need not be a matrix of the form $H_D$ as defined above. It could also be a matrix $H_D$ having a triangle sub-matrix D or any other adequate parity-check matrix H representing the block code used.

Based on the configuration graph CG various decoding algorithms are available. Considering ML decoding, the most likely codeword $x_{ML}$ maximizes the expression (assuming a binary linear code and a binary modulation scheme)

$$x_{ML} = \text{argmax}_{x \in c}(\Sigma_{i=1, ..., n}(-2x_i+1)y_i) \quad (3)$$

with $y_i$ being the log-likelihood ratios calculated out of the received data samples $r_i$ by e.g.

$$y_i = \log\left(\frac{Pr(r_i | x_i = 0)}{Pr(r_i | x_i = 1)}\right), i = 1, \ldots, n. \quad (4)$$

Here, C denotes the set of (valid) codewords.

Let $$c(P) = \Sigma_{v_i \in P} w_i \quad (5)$$

be the cost of a vertex packing P, with $w_i$ being a weight assigned to node $v_i$. Decoding can be performed by finding the m-packing with the maximum cost. If the weights $w_i$ are assigned to the nodes of the configuration graph CG in such way that every m-packing (codeword) has the same cost as the maximum likelihood sum of the corresponding codeword, then ML decoding can be performed by finding the m-packing with the maximum cost. When using a parity-check matrix of the form $H_D$ as defined above and an adequate cost function, the maximum vertex packing on the configuration graph CG always has m elements. In this case, the decoding problem can be formulated as a maximum-weighted vertex packing problem (VPP).

In one embodiment, the solution of the maximum-weighted vertex packing problem (VPP) may require high computational expenses. In the following embodiment, more simple algorithms for vertex packing decoding are provided.

Figure 4:
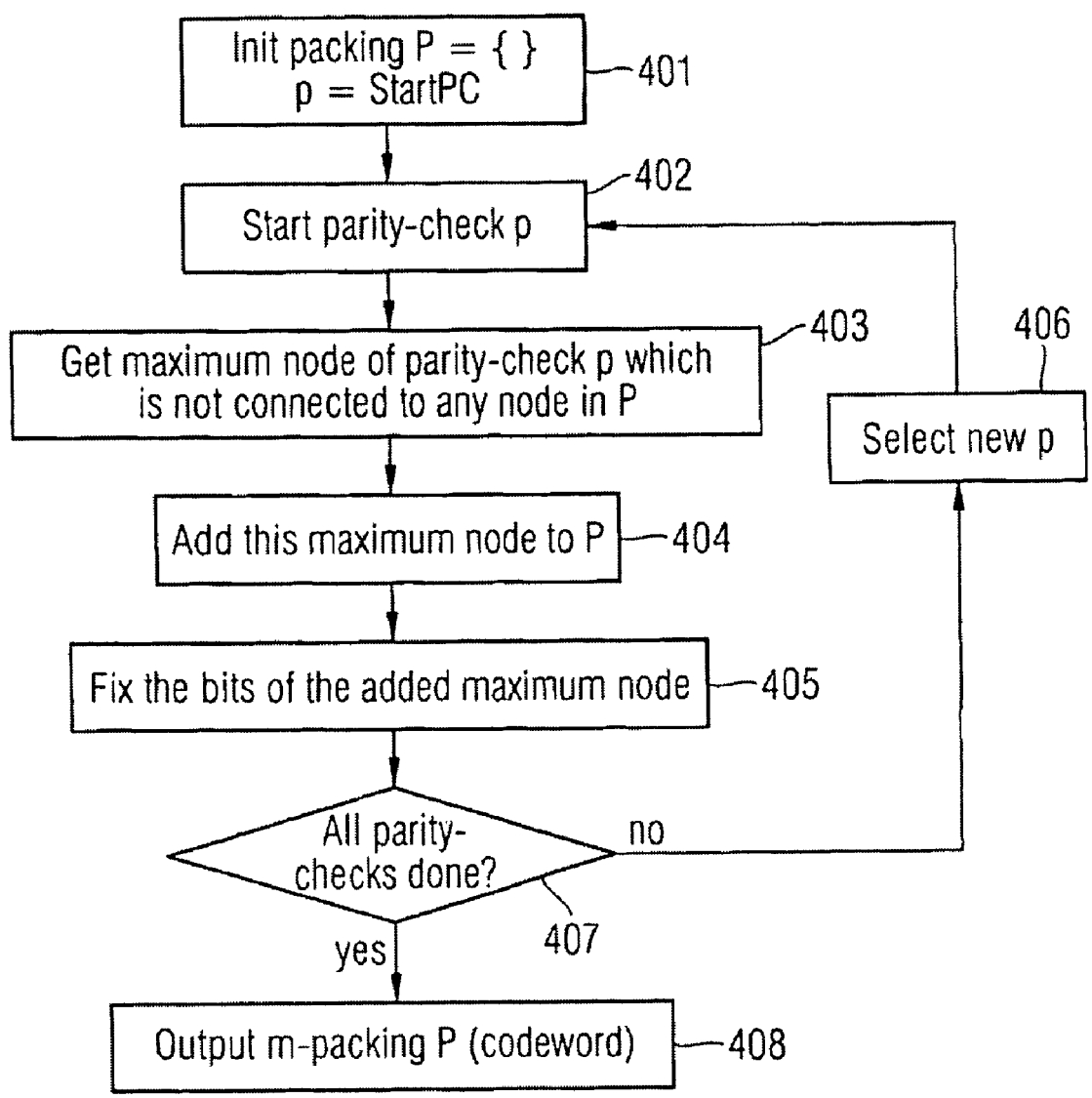
FIG. 4 is a flow diagram illustrating a method of decoding.

Because of the underlying structure of the configuration graph CG, in one embodiment, it is possible to perform decoding by using only a partial structure of the configuration graph CG rather than the whole configuration graph CG. This approach uses the concept to find the maximum node (i.e. symbol group) of a parity-check p in the configuration graph CG depending on maximum nodes already decided in previous parity-checks and reliability information of received data. In particular, when using a greedy algorithm for decoding, in one embodiment, only the "next maximum possible node $v_{pi}$" may be of interest. An embodiment of a decoding process is illustrated in FIG. 4.

The process starts with a packing P={ } having no elements (nodes). A specific parity-check p=StartPC is selected for the first iteration, e.g. p=0, at 401. Then, the parity-check p is started at 402.

The maximum node of parity-check p, which is not connected to any node in P, is computed at 403. In the first iteration, P={ } and therefore, any node associated with p=StartPC is possible. The maximum node may be calculated based on weights associated with the nodes of parity-check p. More specifically, the maximum node of parity-check p may be the node $v_{pi}$ having maximum weight $w_i$. The weights $w_i$ may be calculated from any reliability information on received data such as e.g. log-likelihood ratios $y=(y_1, \ldots, y_n)$ (see equation (4)) or soft output values $\tilde{y}$ of a previous decoder, as will be explained in more detail later. Another possible variant of the algorithm could be to generate codewords by not only selecting the maximum nodes of a parity-check, but also by selecting those with the second highest cost or any other nodes, using e.g. local search techniques.

The maximum node is added to packing P at 404. In the first iteration, packing P now contains one node.

The symbols (e.g. bits) of the maximum added node may be fixed according at 405. If the symbols are fixed, the algorithm may be configured to never reconsider its choice in one embodiment. Such algorithm is often referred to as a greedy algorithm. It is to be noted that the algorithm may also be devised to reconsider choices, i.e. to change one or more symbols of a maximum node which has already been added to packing P.

After the first iteration, a new parity-check p is selected at 406, e.g. p=1. This new parity-check is then started at 402 and the process described above is repeated for this new parity-check. Note that the maximum node of the current parity-check is obtained amongst those nodes which symbols coincide with the already fixed symbols, because the maximum node of the current parity-check p is obtained amongst those nodes which are not connected in the configuration graph CG to any other node in packing P. Thus, the maximum node of the current parity-check p is selected based on the already selected node(s) and on reliability information on received data.

This new maximum node is then added to P at 404 and optionally, the symbols thereof are fixed at 405. This process is repeated until at 407, it is found that all parity-checks have been processed. When all parity-checks have been processed according to the above scheme, packing P is a vertex packing with m elements (i.e. is an m-packing) and thus represents a codeword. This codeword is then output at 408.

Figure 5:
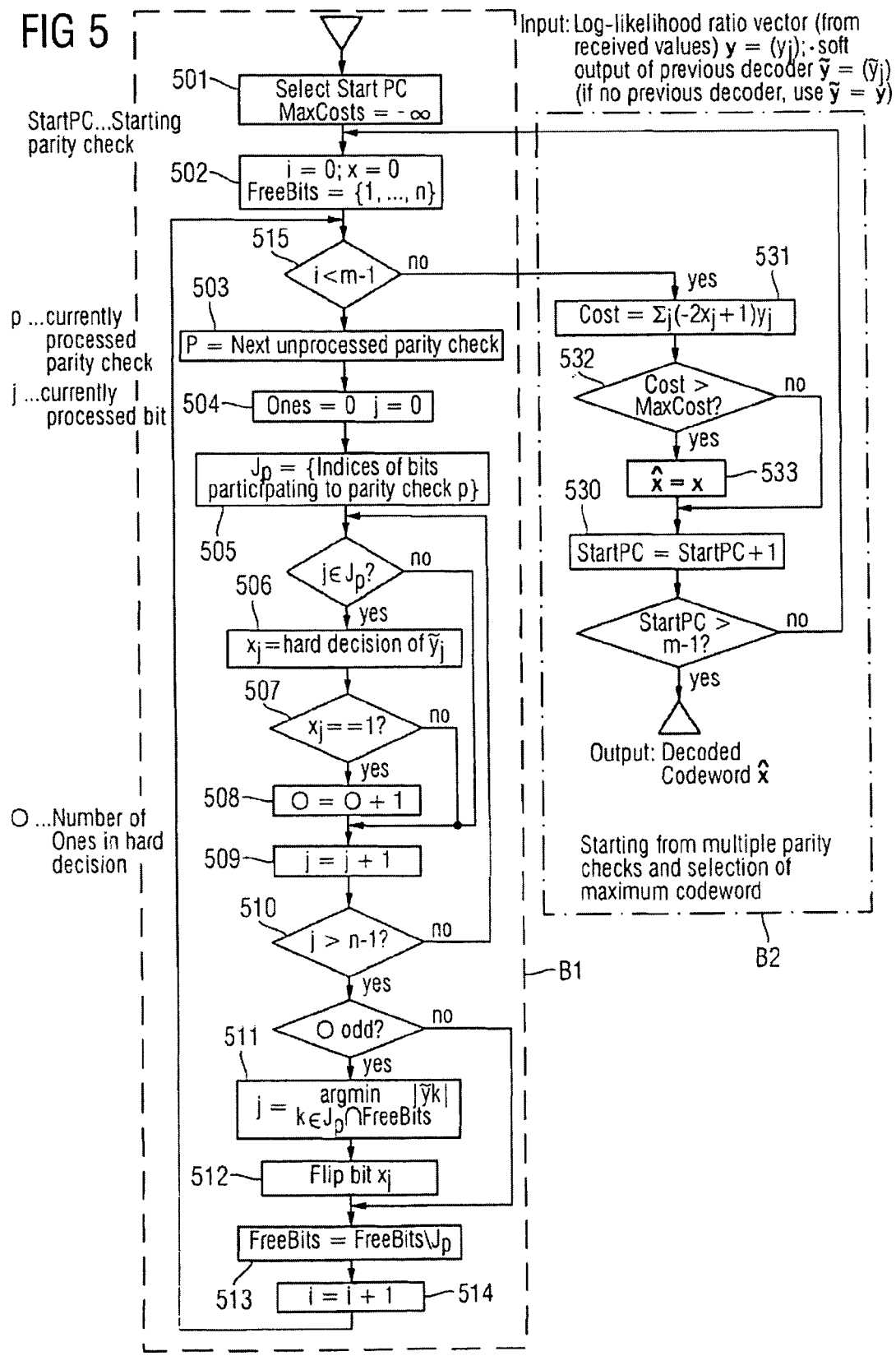
FIG. 5 is a flow diagram illustrating a method of decoding.

A detailed example of a decoding algorithm using the decoding scheme of FIG. 4 is shown in FIG. 5. Here, a binary representation of received data and code is used for ease of explanation. First, only block B1 of the algorithm is described.

For the sake of brevity, only some of the steps shown in FIG. 5 are discussed in detail in the following. After initialization at 501 and 502, without loss of generality, in the first iteration step i=0, p is set to StartPC, e.g. p=0 (act 503). All bits participating to parity-check p (i.e. the bits defined by $J_p$) are derived at 504, 505. The hard decision $x_j$ of all bits participating to parity-check p is calculated from reliability information, e.g. log-likelihood ratios y or soft output values $\tilde{y}$ of a previous decoder at 506. This hard decision $x_j$ of all bits participating to parity-check p may be considered to represent the maximum node, if this node satisfies the parity-check p and is not interconnected to any other node in packing P. At 507, 508, 509 and 510, the number O of "ones" in the node under consideration is counted. If this number is even, the node satisfies the parity-check p and therefore, the bits thereof may be fixed. A set of indices termed FreeBits indicates those bits of the packing P which currently are not yet fixed. In the first iteration step i=p=0, FreeBits={1, ..., n}. i.e. no bits are fixed. Therefore, if the number of ones of the hard decision is even, the hard decision satisfies the parity-check p and may thus be considered to already represent the maximum node (bit group) of this parity-check p. Otherwise, if the number of ones of the hard decision is odd, by identifying the bit with the minimum absolute value (minimum reliability) and flipping the sign thereof (at 511, 512), the resulting hard decision may be considered to represent the maximum node of the parity-check p. In both cases, the bits of this maximum node are then fixed by updating the set FreeBits at 513. The set FreeBits is updated by FreeBits=FreeBits\$J_p$, i.e. the bits at the positions indicated by $J_p$ are excluded. As mentioned before, $J_p$ is the set of indices of bits participating to current parity-check p. In the first iteration step i=p=0, the bits at the bit positions $J_0$ are fixed.

In the following iteration steps, this scheme is repeatedly applied to get the proper maximum nodes of the other parity-checks in such way that it is always maintained that the set of nodes is a valid vertex packing. To do so, in the next iteration step i=i+1 (act 514), the hard decision of bits of a new parity-check p+1 is done, considering the already fixed bits. If the number of ones of this hard decision (including the already fixed bits, if any) is even, this hard decision satisfies the new parity-check p+1 and may thus be considered to already represent the maximum node (bit group) related to this parity-check. However, if the number of ones of this hard decision (including the already fixed bits, if any) is odd, in order to maintain an even number of ones, this time only that bit is flipped which has the lowest reliability (e.g. lowest absolute value of log-likelihood ratio or soft output value) but is among those bits which are not already fixed by another parity-check. The index j of this bit may be calculated according to 511 by $$j = \operatorname*{argmin}_{k \in J_p \cap FreeBits} |\tilde{y}_k|. \quad (6)$$

It is to be noted that it is also possible to flip more than one bit. As an example, in order to maintain an even number of ones, those three, five etc. bits having the lowest reliability but are among those bits which are not already fixed by another parity-check may be flipped. Decoding according to block B1 of the algorithm may be accomplished if all parity-checks are processed, i.e. i=m−1 (i.e. p=m−1), see 515. The m-packing yielded by this decoding scheme is a (valid) codeword of local maximum cost.

In more general terms, the above algorithm relies on the following concept. First, the part of the reliability information associated with a first parity-check p is translated into a first hard-decided group of symbols. Then, it is checked whether or not the first hard-decided group of symbols satisfies the first parity-check p. As explained above, in case the symbols are bits, this check may e.g. simply be performed by evaluating whether or not the number of ones of the hard-decided group of bits is even or odd. If the first parity-check is satisfied, the first hard-decided group of symbols is selected as a node of packing P and its symbols may be fixed (or may only be fixed after being verified and possibly changed at a later time when one or more following parity-checks have been processed). If, however, the first parity-check is not satisfied, one or more symbols of the first hard-decided group of symbols are changed based on the reliability information such that the first parity-check p is then satisfied. The first hard-decided group of symbols including the changed symbol is then selected as a node of packing P and its symbols may be fixed (or may only be fixed after being verified and possibly changed at a later time when one or more following parity-checks have been processed). That way, the first group of symbols (first node) relating to the first parity-check is found. In the next iteration step, the part of the reliability information associated with the second parity-check is translated into a second hard-decided group of symbols. It is checked whether or not a second hard-decided group of symbols, which is compatible with the selected first group of symbols, satisfies the second parity-check. If the second parity-check is satisfied, this compatible second hard-decided group of symbols is selected as a second node of packing P and its symbols may be fixed (or may only be fixed after being verified and possibly changed at a later time when one or more following parity-checks have been processed). However, if the second parity-check is not satisfied, one or more "free" (i.e. not yet fixed) symbols of the compatible second hard-decided group of symbols are changed based on the reliability information such that the second parity-check is then satisfied. This second hard-decided group of symbols including the changed symbol is then selected as a second node of packing P and its symbols may be fixed (or may only be fixed after being verified and possibly changed at a later time when one or more following parity-checks have been processed). The codeword may then be composed group-by-group out of these groups of symbols.

Several variants may be applied to this process. The groups of symbols (i.e. nodes of CG) may be associated with a plurality of parity-checks rather than exactly one parity-check. By way of example, if one group of symbols is associated with e.g. two parity-checks, this group may be arranged by combining two groups of symbols each associated with one of these parity-checks. Another possibility is to redefine the configuration graph CG in a way that a row of the configuration graph CG is associated with a plurality of parity-checks. The set of indices $J_p$ associated with this "combinatorial" parity-check p may be given by the set union of the sets of indices relating to the individual parity-checks participating to the "combinatorial" parity-check p. As a result, groups of symbols as referred herein (as well as nodes of the CG) may relate to different numbers of parity-checks.

In the following, a decoding example for the small code shown in FIG. 3 is presented by way of example. It is assumed that the reliability values (e.g. the log-likelihood ratios $y_i$ of the received data signal) have been calculated at the receiver 200 as y=[−5,−1,1,−5,−6]. It is further assumed that the algorithm starts at parity-check p=0. The bits at positions 0, 1 and 3 are participating to parity-check p=0. The reliability values of the corresponding received data are −5, −1, −5. The hard decision of these reliability values is 1, 1, 1. Because the number of ones in the hard decision is odd, one bit should be flipped, according to the above algorithm those with the lowest absolute reliability value, here the bit at position 1 (i.e. having index 1). This leads to the hard decision of 1, 0, 1 which corresponds to node $v_{02}$ in the configuration graph CG of FIG. 3. So, packing P={$v_{02}$}. The following bits are fixed in the resulting codeword: [1, 0, x, 1, x]. Here, x refers to a bit which is not yet fixed. Thus, FreeBits={2, 4}.

In the next step parity-check p=1 is considered. The bits at positions 1, 2 and 4 are participating to parity-check p=1. Bit position 1 is common to parity-checks p=0 and p=1. The reliability values of the corresponding received data are −1, 1, −6. The hard decision of these values using bit at position 1 be fixed to zero from the first step is 0, 0, 1. Again the number of ones in the hard decision is odd, so those bit which has the smallest absolute reliability value but is not fixed by previous steps is to be flipped. Here this is bit at position 2. So the resulting hard decision after flipping is 0, 1, 1, which corresponds to node $v_{11}$ in the configuration graph CG. Thus, P={$v_{02}$, $v_{11}$} and the resulting codeword is [1,0,1,1,1].

Many variants of this algorithm are possible. The algorithm relies on making a locally optimum choice (of the maximum node) at each stage of iteration with the hope of finding the global optimum (i.e. ML decoding). For instance, the degree of locality may be varied. In the above example, the computation of the maximum node only relies on reliability information (e.g. log-likelihood ratios or soft output values) associated with the node of the current parity-check. However, reliability information used for computing a maximum node may also consider the "potential" of this selection in view of subsequent parity-checks, i.e. reliability information associated with parity-checks to be done later. Further, as already mentioned above, the algorithm may reconsider choices made in the (near) past, resulting e.g. in that bits of an added maximum node may not necessarily be irrevocably fixed for the next parity-check.

Typically, the outputted m-packing P of the algorithm described above is dependent on the order of parity-checks used in the iteration process. Thus, the algorithm may be repeated a number of times, every time starting from another parity-check. For instance, the algorithm may be started m times, i.e. from each parity-check and/or using different processing sequences of the parity-checks. This leads to a list of m codewords. Amongst these codewords, the codeword with the maximum cost may be chosen as a decoding result. It is to be noted that, inter alia, a parity-check matrix of the form $H_D=[D\ I]$, with I is the m×m identity matrix, guarantees that an arbitrary order of parity checks p in the repeatedly performed algorithm may be used. On the other hand, a parity-check matrix of the form $H_D=[D\ T]$, with T is a triangular matrix may be used and may have advantages, e.g. in terms of storage memory needed, but may require special processing orders for the discussed algorithms.

Block B2 of FIG. 5 illustrates a flow chart showing a specific example of an extended (i.e. repeatedly performed) algorithm as outlined above. The steps in block B2 relate to the "outer" algorithm relying on repeated executions of the "inner" algorithm of block B1, and a selection of the decoded codeword $\hat{x}$ as the codeword having maximum cost of the codewords x yielded by the inner algorithm. Subsequent iterations of the outer algorithm are initiated by updating StartPC=StartPC+1, see act 530. Here, as a simple example, an incremental processing order of parity-checks is used. The cost of a codeword x may be computed at 531 on the basis of the log-likelihood ratio vector y according to $$\text{Cost}(x)=\Sigma_j(-2x_j+1)y_j. \quad (7)$$

Reliability information of other quantities than log-likelihood ratios, e.g. the soft output values of a previous decoder, may also be used as vector y in equation (7).

At 532, it is checked whether or not the cost of the current codeword x is greater than the maximum cost "MaxCost" of all codewords computed so far. If yes, codeword $\hat{x}$ and thus MaxCost are updated at 533.

As the time complexity of the (inner) algorithm depicted in FIG. 4 or block B1 in FIG. 5 is $O(m)$, when starting the algorithm m times, this results in a time complexity of $O(m^2)$ of the extended (i.e. repeatedly performed) algorithm. This low complexity makes the extended algorithm especially interesting for high rate codes.

Figure 6:
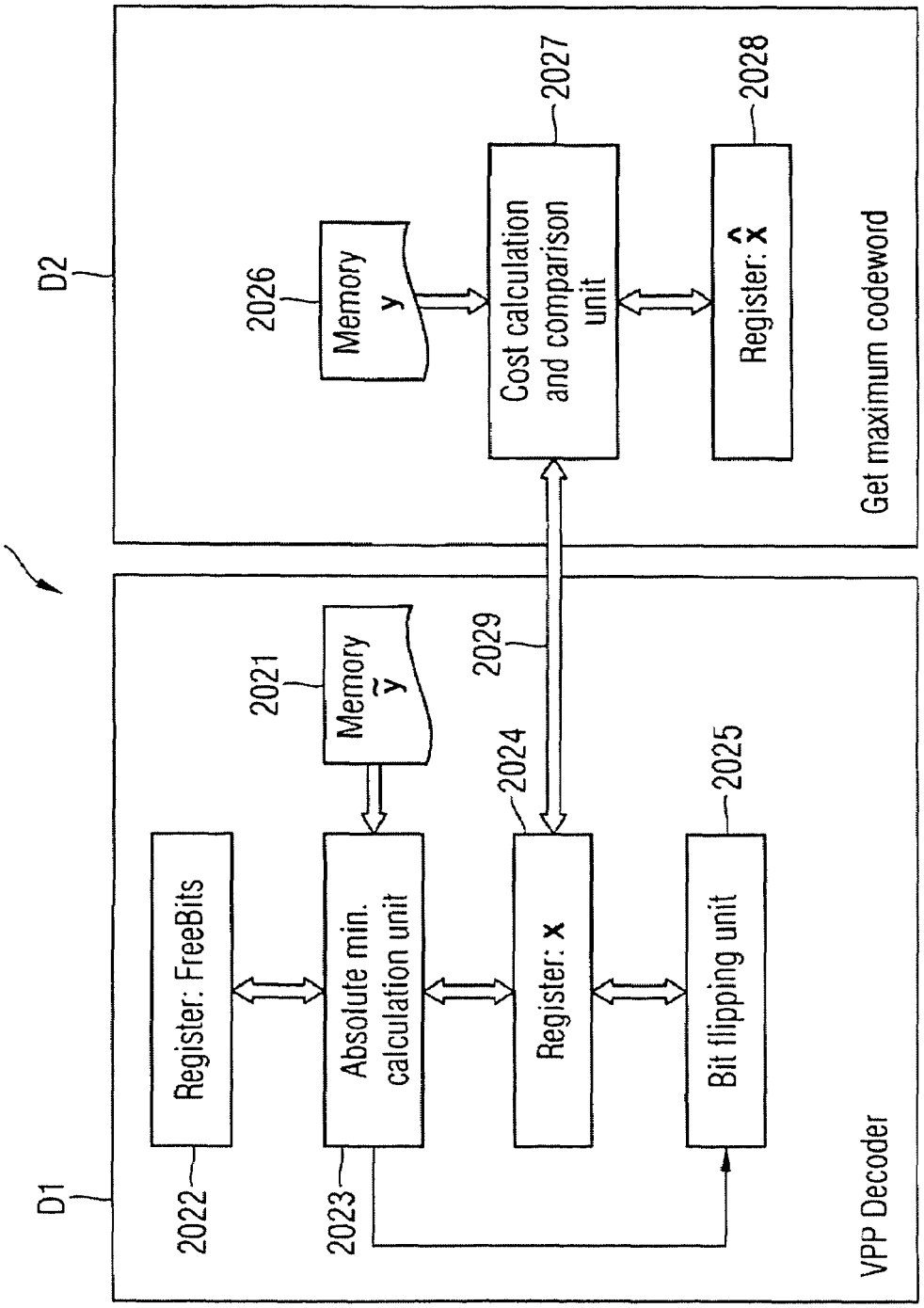
FIG. 6 is a schematic representation of a decoder.

FIG. 6 is a schematic representation of a decoder 2020 which may be used as a decoder 202 in FIG. 1 according to one embodiment. The decoder 2020 may comprise a block D1 which is configured to perform e.g. calculations relating to the (inner) algorithm as depicted in FIG. 4 or FIG. 5 (steps in block B1), and may optionally be equipped with a block D2 which is configured to perform e.g. calculations relating to the extended algorithm such as e.g. depicted in block B2 of FIG. 5.

Block D1 may comprise a first memory 2021, a free bits register 2022, an absolute minimum calculation unit 2023, a first codeword register 2024 and a bit flipping unit 2025. Block D2 may comprise a second memory 2026, a cost calculation and comparison unit 2027 and a second codeword register 2028. The first codeword register 2024 is connected to the cost calculation and comparison unit 2027 via data link 2029. Data processing in decoder 2020 may be performed as described above, e.g. according to the decoding method exemplified in FIG. 4 or 5. Reliability information of the received symbols is stored in the first memory 2021. Soft output values $\tilde{y}$ of a previous decoder or log-likelihood ratios y or both may e.g. be used. Free bits register 2022 may hold the aforementioned set of indices "FreeBits" indicating those bits of packing P which currently are not yet fixed. The absolute minimum calculation unit 2023, in each iteration step, calculates the bit to be flipped according to equation (6).

In other words, if a bit in a node has to be flipped, the absolute minimum calculation unit 2023 calculates this bit, namely the bit having the index j. This index j (i.e. bit position) is reported to the bit flipping unit 2025. The bit flipping unit 2025 accesses first codeword register 2024 and flips the bit with index j (being a bit of the current node added to packing P). When all parity-checks are processed, first codeword register 2024 stores the m-packing P, i.e. codeword x. Codeword x forms the output of the (inner) algorithm B1 for one run. Thus, the absolute minimum calculation unit 2023, the free bits register 2022 and the bit flipping unit 2025 form a selection unit configured to select groups of bits associated with a specific parity-check based on the reliability information obtained from first memory 2021. The first codeword register 2024 is then used to compose the codeword x out of such selected groups of bits.

When this (inner) algorithm is repeated e.g. m times, m codewords x are passed to the cost calculation and comparison unit 2027 of block D2. The cost calculation and comparison unit 2027 performs a calculation of equation (7) for each codeword x by using e.g. log-likelihood ratios y as stored in the second memory 2026. The codeword x having maximum cost is passed to the second codeword register 2028 as maximum codeword $\hat{x}$.

Figure 7:
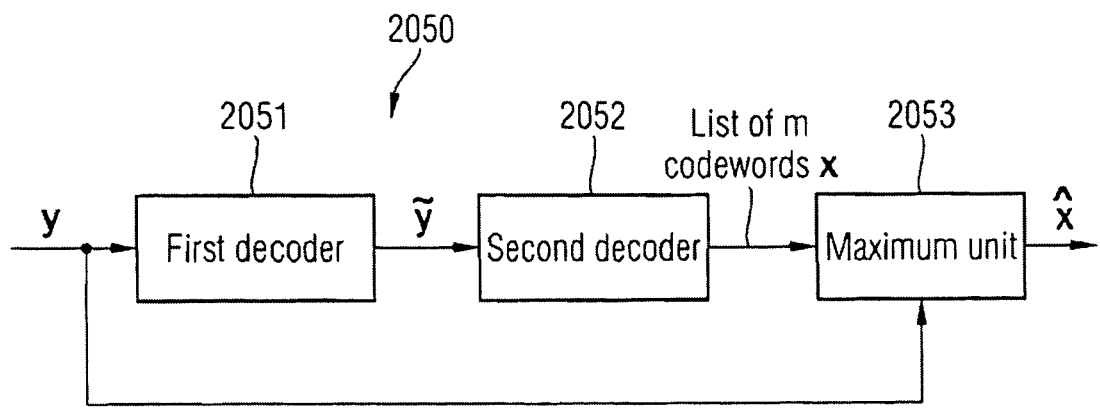
FIG. 7 is a schematic representation of a decoder.

FIG. 7 is a schematic representation of a decoder 2050 according to one embodiment. The decoder 2050 may comprise a first decoder 2051, a second decoder 2052 and a maximum unit 2053. Note that the second decoder 2052 may be represented by block D1 of the decoder 2020 of FIG. 6 and the maximum unit 2053 may be represented by block D2 of decoder 2020 of FIG. 6.

The first decoder 2051 may be a soft output decoder providing for soft output values $\tilde{y}$. For example, a belief propagation (BP) decoder could be used. The first decoder 2051 may perform a first decoding process on the basis of received log-likelihood ratios y. The soft output values $\tilde{y}$ of the first decoder 2051 are then used as input values to the second decoder 2052. The second decoder 2052 may be a VPP decoder. The performance of the second decoder 2052, which is optionally followed by the maximum unit 2053, is improved by the pre-decoding performed in the first decoder 2051. That is, the codewords x outputted by the second decoder 2052 are of higher quality than hard decisions of the soft output values $\tilde{y}$ of the first decoder 2051. Note that for the evaluation of the maximum codeword $\hat{x}$, the maximum unit 2053 may use the (original) log-likelihood ratio values y rather than the soft output values $\tilde{y}$.

Figure 8:
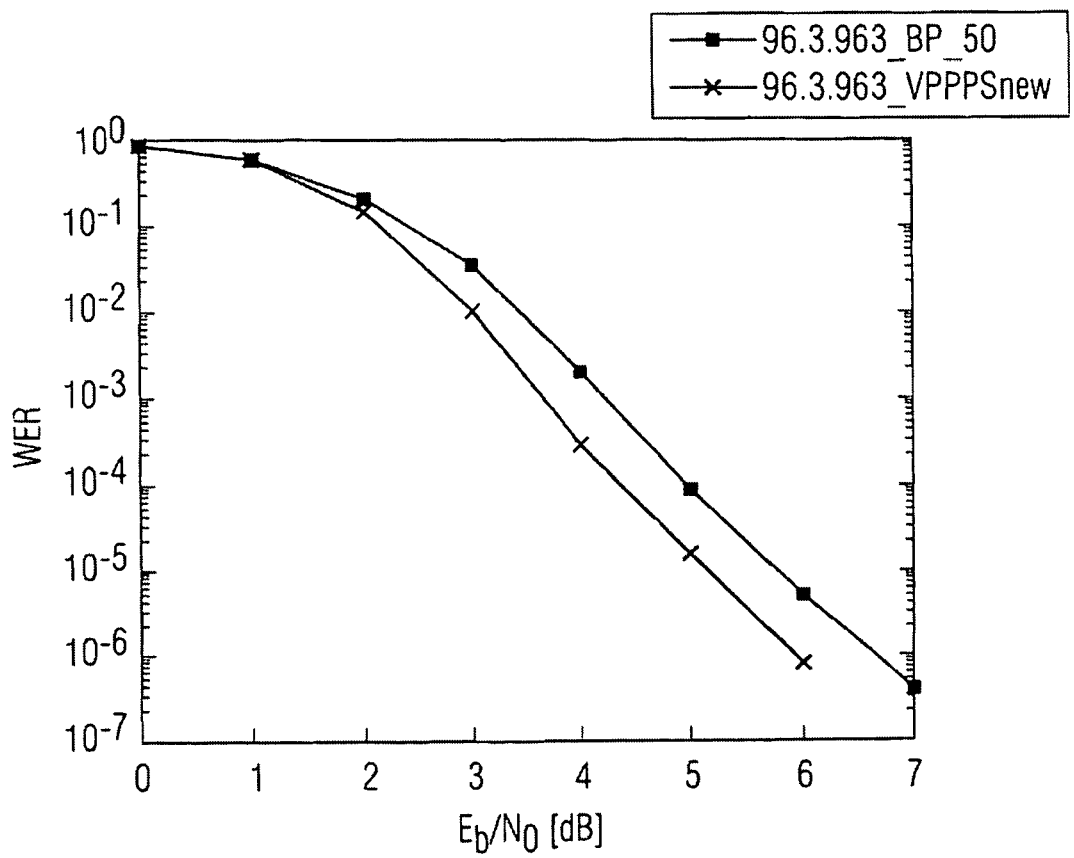
FIG. 8 is a graph showing for a first code the word error ratio of a decoder output plotted versus the energy per bit to noise power spectral density ratio.

FIG. 8 shows simulation results for an example block code. The decoding performance is provided in terms of word error rate (WER) and is plotted versus the energy per bit to noise power spectral density ratio $E_b/N_0$ in units of dB. The block code 96.3.963 used in the simulation of FIG. 8 is disclosed in D. MacKay, Encyclopedia of Sparse Graph Codes (hypertext archive), online available at: http://www.inference.phy.cam.ac.uk/mackay/codes/data.html. By way of example, code 96.3.963 is represented by a parity-check matrix H having n=96 columns and m=48 rows. These and all other codes disclosed in this document may be used in encoder 101 for encoding and are incorporated in this document by reference. The simulations have been performed with the decoder 2050 of FIG. 7, i.e. a cascade of a BP decoder 2051 and a VPP decoder 2052 followed by the maximum unit 2053. The BP decoder 2051 was run with 50 iterations at maximum, and the VPP decoder 2052 used the algorithm shown in FIG. 5. In FIG. 8, the performance of the BP decoder 2051 alone (line 96.3.963_BP_50) is compared to the performance of the combined BP-VPP decoder 2050 (line 96.3.963_VPPPSnew). For the code 96.3.963, a performance improvement in terms of WER up to 0.6 dB is obtained, see FIG. 8. Thus, VPP post decoding may significantly improve the decoding performance of a soft output decoder.

While a particular feature or aspect of an embodiment of the invention may have been disclosed with respect to only one of several implementations, such feature or aspect may be combined with one or more other features or aspects of the other implementations as may be desired and advantageous for any given or particular application.

What is claimed is:

1. A method of decoding data symbols, wherein the data symbols have been coded by using a linear block code, the method comprising:
   providing reliability information of the data symbols;
   selecting a first group of symbols from a first set of groups of symbols, wherein the first set of groups of symbols is defined by at least a first parity-check of a parity-check matrix of the linear block code, and wherein the selection is based on the reliability information;
   selecting a second group of symbols from a second set of groups of symbols, wherein the second set of groups of symbols is defined by at least a second parity-check of the parity-check matrix, wherein the at least second parity-check is different from the at least first parity-check, and wherein the selection is based on the selected first group of symbols and the reliability information; and
   composing at least a part of a codeword to comprise the first group of symbols and the second group of symbols.

2. The method of claim 1, wherein selecting the first group of symbols comprises:
   translating a part of the reliability information associated with the at least first parity-check into a first hard-decided group of symbols;
   checking whether or not the first hard-decided group of symbols satisfies the at least first parity-check;
   if the at least first parity-check is satisfied, selecting as a first group of symbols the first hard-decided group of symbols;
   if the at least first parity-check is not satisfied, changing a symbol of the first hard-decided group of symbols based on the reliability information such that the at least first parity-check is satisfied, and selecting as a first group of symbols the first hard-decided group of symbols including the changed symbol.

3. The method of claim 1, wherein selecting the second group of symbols comprises:
   translating a part of the reliability information associated with the second parity-check into a second hard-decided group of symbols which is compatible with the selected first group of symbols;
   checking whether or not the second hard-decided group of symbols satisfies the at least second parity-check;
   if the at least second parity-check is satisfied, selecting as a second group of symbols the second hard-decided group of symbols;
   if the at least second parity-check is not satisfied, changing a symbol of the second hard-decided group of symbols based on the reliability information such that the at least second parity-check is satisfied, and selecting as the second group of symbols the second hard-decided group of symbols including the changed symbol.

4. The method of claim 1, wherein the reliability information of the data symbols is provided by computing log-likelihood ratios of the data symbols.

5. The method of claim 1, wherein the reliability information of the data symbols is provided by soft-decoding the data symbols.

6. The method of claim 1, further comprising:
   repeating the aforementioned acts a number of times by using different orders of parity-checks, whereby a number of codewords are obtained;
   computing a cost of each obtained codeword; and
   selecting the codeword having a maximum cost.

7. The method of claim 6, wherein the cost of an obtained codeword is calculated based on log-likelihood ratios of the data symbols.

8. A method of decoding data symbols into codewords, wherein the data symbols have been coded using a linear block code, wherein an m×n parity-check matrix comprising one or more parity-checks p of the linear block code defines a set of symbol groups and interconnections between the symbol groups according to the following rules:
   each one or more parity-checks p define an index set $J_p$ of codeword symbol positions participating in the one or more parity-checks p;
   each index set $J_p$ of codeword symbol positions defines a plurality of symbol groups $v_{pi}$ indexed by i, each symbol group $v_{pi}$ satisfying the one or more parity-checks p at index set $J_p$ of codeword symbol positions; wherein
   two symbol groups $v_{pi}$ and $v_{p'i'}$ are interconnected if at least one symbol of symbol group $v_{pi}$ and one symbol of symbol group $v_{p'i'}$, which are located at a common position of the index set $J_p$ and the index set $J_{p'}$, are different;
   wherein the method comprises:
   providing reliability information of the data symbols;
   selecting symbol groups that are not mutually interconnected to each other from the set of symbol groups, wherein the selection depends on the reliability information; and
   composing the codeword on the basis of the selected symbol groups.

9. The method of claim 8, wherein selecting symbol groups and composing the codeword on the basis of the selected symbol groups comprises:
   selecting a first symbol group $v_{pi}$ associated with at least a first parity-check p depending on the reliability information related to the index set $J_p$;
   setting all symbols of the codeword at the symbol positions of the index set $J_p$ to the symbols of the selected first symbol group $v_{pi}$;
   selecting a second symbol group $v_{p'i'}$ associated with at least a second parity-check p' depending on the reliability information related to the index set $J_{p'}$;
   setting all symbols of the codeword at the symbol positions of the index set $J_{p'}$ to the symbols of the selected second symbol group $v_{p'i'}$; and
   continuing to process further parity-checks according to the above scheme until all symbols of the codeword are set.

10. The method of claim 8, wherein the reliability information of the data symbols is provided by computing log-likelihood ratios of the data symbols.

11. The method of claim 8, wherein the reliability information of the data symbols is provided by soft-decoding the data symbols.

12. The method of claim 8, further comprising:
   repeating the aforementioned acts a number of times by using different orders of parity-checks, whereby a number of codewords are obtained;
   computing a cost of each obtained codeword; and
   selecting the codeword having a maximum cost.

13. The method of claim 12, wherein the cost of an obtained codeword is calculated based on log-likelihood ratios of the data symbols.

14. A decoder for decoding data symbols that have been coded by using a linear block code, comprising:
a storage unit configured to store reliability information of the data symbols;
a group of symbols selection unit configured to select groups of symbols, wherein each group of symbols is associated with one or more specific parity-checks of a parity-check matrix of the linear block code, and wherein the selection is based on the reliability information, wherein a first specific parity-check of a first group of symbols is different from a second specific parity-check of a second group of symbols; and
a unit configured to compose a codeword that comprises selected groups of symbols.

15. The decoder of claim 14, further comprising:
a register configured to store symbol positions of the codeword to which no group of symbols has yet been selected.

16. The decoder of claim 14, further comprising:
a calculation unit configured to calculate a cost of the composed codeword.

17. The decoder of claim 16, further comprising:
a codeword selection unit configured to select a codeword from a number of composed codewords depending on the costs of the number of codewords.

18. A decoder for decoding data symbols that have been coded by using a linear block code, comprising:
a first decoder configured to decode the data symbols to provide soft output values;
a second decoder configured to decode the soft output values to provide a codeword, wherein the second decoder comprises:
a storage unit configured to store the soft output values;
a group of symbols selection unit configured to select groups of symbols, wherein each group of symbols is associated with one or more a specific parity-checks of a parity-check matrix of the linear block code, and wherein the selection is based on the soft output values, wherein a first specific parity-check of a first group of symbols is different from a second specific parity-check of a second group of symbols; and
a unit configured to compose the codeword that comprises selected groups of symbols.

19. The decoder of claim 18, the second decoder further comprising:
a register configured to store symbol positions of the codeword to which no group of symbols has yet been selected.

20. The decoder of claim 18, the second decoder further comprising:
a calculation unit configured to calculate a cost of the composed codeword.

21. The decoder of claim 20, further comprising:
a codeword selection unit configured to select a codeword from a number of composed codewords depending on the costs of the number of codewords.

22. The decoder of claim 18, wherein the first decoder comprises a belief propagation decoder.

23. A method of decoding data symbols into codewords, wherein the data symbols have been coded using a linear block code, wherein an m×n parity-check matrix comprising one or more parity-checks p of the linear block code defines a set of symbol groups and interconnections between the symbol groups according to the following rules:
each one or more parity-checks p define an index set $J_p$ of codeword symbol positions participating in the one or more parity-checks p;
each index set $J_p$ of codeword symbol positions defines a plurality of symbol groups $v_{pi}$ indexed by i, each symbol group $v_{pi}$ satisfying the one or more parity-checks p at index set $J_p$ of codeword symbol positions; wherein
two symbol groups $v_{pi}$ and $v_{p'i'}$ are interconnected if at least one symbol of symbol group $v_{pi}$ and one symbol of symbol group $v_{p'i'}$, which are located at a common position of the index set $J_p$ and the index set $J_{p'}$, are different;
wherein the method comprises:
assigning weights to symbol groups;
selecting symbol groups that are not mutually interconnected to each other from the set of symbol groups, wherein the selection depends on the weights; and
composing the codeword on the basis of the selected symbol groups.

24. The method of claim 1, wherein the first set of groups of symbols and the second set of groups of symbols are defined by first index sets of codeword symbols and second index sets of codeword symbols, respectively, that are associated with at least the first parity-check and the second parity-check, respectively, wherein each group of symbols of the first set of groups of symbols satisfies the at least first parity-check at the first index set and each group of symbols of the second set of groups of symbols satisfies the at least second parity-check at the second index set.

25. The method of claim 1, wherein the at least second parity-check defines at least one new symbol of the codeword that is not already defined by the at least first parity-check.

26. The decoder of claim 14, wherein a first set of groups of symbols and a second set of groups of symbols are defined by first index sets of codeword symbols and second index sets of codeword symbols, respectively, that are associated with at least the first parity-check and the second parity-check, respectively, wherein each group of symbols of the first set of groups of symbols satisfies the at least first parity-check at the first index set and each group of symbols of the second set of groups of symbols satisfies the at least second parity-check at the second index set.

27. The decoder of claim 14, wherein the second parity-check defines at least one new symbol of the codeword that is not already defined by the first parity-check.

28. The decoder of claim 18, wherein a first set of groups of symbols and a second set of groups of symbols are defined by first index sets of codeword symbols and second index sets of codeword symbols, respectively, that are associated with at least the first parity-check and the second parity-check, respectively, wherein each group of symbols of the first set of groups of symbols satisfies the at least first parity-check at the first index set and each group of symbols of the second set of groups of symbols satisfies the at least second parity-check at the second index set.

29. The decoder of claim 18, wherein the second parity-check defines at least one new symbol of the codeword that is not already defined by the first parity-check.

* * * * *